(12) United States Patent
Tebbe et al.

(10) Patent No.: US 7,353,592 B2
(45) Date of Patent: Apr. 8, 2008

(54) METHOD OF FABRICATING AN RF SUBSTRATE WITH SELECTED ELECTRICAL PROPERTIES

(75) Inventors: Dennis Tebbe, Melbourne, FL (US); Thomas Smyth, Palm Bay, FL (US); Terry Provo, Indialantic, FL (US); Dara Ruggiero, Melbourne, FL (US)

(73) Assignee: Harris Corporation, Melbourne, FL (US)

( * ) Notice: Subject to any disclaimer, the term of this patent is extended or adjusted under 35 U.S.C. 154(b) by 0 days.

(21) Appl. No.: 11/622,012

(22) Filed: Jan. 11, 2007

(65) Prior Publication Data

US 2007/0117403 A1    May 24, 2007

Related U.S. Application Data

(62) Division of application No. 10/694,468, filed on Oct. 27, 2003, now Pat. No. 7,181,834.

(51) Int. Cl.
*H05K 3/36* (2006.01)

(52) U.S. Cl. ............................ 29/830; 29/846; 29/835; 29/600; 156/89.11

(58) Field of Classification Search .................. 29/830, 29/846, 835, 600, 601, 592.1; 156/89.11, 156/89.12, 153, 263, 265, 297, 299; 343/700 MS, 343/909; 333/128, 108, 204
See application file for complete search history.

(56) References Cited

U.S. PATENT DOCUMENTS

| | | | |
|---|---|---|---|
| 5,869,894 A | 2/1999 | Degani et al. | |
| 6,036,798 A | 3/2000 | Nishide et al. | |
| 6,770,159 B1 | 8/2004 | Tebbe et al. | |
| 6,911,941 B2 * | 6/2005 | Tebbe et al. | 343/700 MS |
| 6,992,636 B2 | 1/2006 | Tebbe et al. | |
| 7,100,276 B2 | 9/2006 | Fukuoka et al. | |
| 7,181,834 B2 * | 2/2007 | Tebbe et al. | 29/830 |
| 2005/0087284 A1 | 4/2005 | Tebbe et al. | |

FOREIGN PATENT DOCUMENTS

| | | |
|---|---|---|
| EP | 1489687 | 5/2004 |
| JP | 409260105 A | 10/1997 |

\* cited by examiner

*Primary Examiner*—Minh Trinh
(74) *Attorney, Agent, or Firm*—Darby & Darby PC; Robert J. Sacco

(57) ABSTRACT

Method for fabricating a textured dielectric substrate (400) for an RF circuit. The method can include the step (104) of selecting a plurality of dielectric substrate materials, each having a distinct combination or set of electrical properties that is different from the combination of electrical properties of every other one of dielectric substrate materials. Selecting a textured substrate patter (106) which is comprised of at least two types of distinct areas respectively having the distinct sets of electrical properties, with each distinct area dimensioned much smaller than a wavelength at a frequency of interest. Cutting the dielectric substrate materials (202, 204) into a size and shape consistent with the distinct areas of the selected pattern so as to form a plurality of dielectric pieces (206, 208). Arranging the dielectric pieces on a base plate (302) in accordance with the selected pattern to form the textured dielectric substrate.

10 Claims, 5 Drawing Sheets

METHOD OF FABRICATING AN RF SUBSTRATE WITH SELECTED ELECTRICAL PROPERTIES

CROSS REFERENCE TO RELATED APPLICATIONS

The application is a divisional of co-pending U.S. patent application Ser. No. 10/694,468 filed Oct. 27, 2003, which is now U.S. Pat. No. 7,181, 834, issued on Feb. 27, 2007.

STATEMENT REGARDING FEDERALLY SPONSORED RESEARCH OR DEVELOPMENT

The United States Government has rights in this invention pursuant to Contract No. F005521 between the Defense Advanced Research Projects Agency, the United States Naval Research Laboratory and Harris Corporation.

BACKGROUND OF THE INVENTION

1. Statement of the Technical Field

The invention concerns dielectric substrates for RF circuits, and more particularly dielectric substrates with selectively tailored electrical properties.

2. Description of the Related Art

RF circuits, including antennas, are commonly implemented on dielectric substrates. Materials commonly used for this purpose include commercially available low and high temperatures cofired ceramics (LTCC, HTCC). For example, low temperature 951 cofire Green Tape™ from Dupont® is Au and Ag compatible, has a acceptable mechanical properties with regard to thermal coefficient of expansion (TCE), and relative strength. It is available in thicknesses ranging from 114 µm to 254 µm and is designed for use as an insulating layer in hybrid circuits, multichip modules, single chip packages, and ceramic printed wire boards, including RF circuit boards. Similar products are available from other manufacturers.

LTCC substrate systems commonly combine many thin layers of ceramic and conductors. The individual layers are typically formed from a ceramic/glass frit that can be held together with a binder and formed into a sheet. The sheet is usually delivered in a roll in an unfired or "green" state. Hence, the common reference to such material as "green tape". Conductors can be screened onto the layers of tape to form RF circuit elements antenna elements and transmission lines. Two or more layers of the same type of tape is then fired in an oven. The firing process shrinks all of the dimensions of the raw part. Accordingly, it is highly important that the material layers all shrink in a precise, well defined way that will provide consistent results from one module to the next.

Other materials commonly used as RF substrates include Teflon® PTFE (PolyTetraFluoroEthylene) composites of glass fiber, woven glass and ceramics. Such products are commercially available from a variety of manufacturers. For example, Rogers Corporation of Chandler, Ariz. offers such products under the trade name RT/duroid including product numbers 5880, 6002, and 6010LM. Unlike LTCC materials, these types of substances do not generally require a firing step before they can be used. Instead, they are typically provided in the form of rigid board material with a conductive metal ground plane formed on one side.

Due to the maturing of the antenna design process, the continued improvement of new antennas is most limited by the choice of substrate materials. However, development of new materials as proved difficult for a variety of reasons. One reason concerns certain incompatibilities of the physical properties associated with diverse materials that would otherwise be desirable to combine in a single dielectric composition. Often, the thermal coefficient of expansion (TCE), chemical properties of the materials, or sintering properties of the material may be inconsistent with one another. For example, different types of unfired ceramics such as Green Tape™ will not fire well together because of different chemical and physical properties of the various different types of materials.

Still, new materials are needed for a variety of reasons. One such reason relates to the limited variety of specific electrical properties that are offered in commercially available dielectric substrate materials. Designers wishing to implement antennas or other RF circuit designs often find themselves constrained by the limitations of material. For example, it may be desirable in a particular instance to implement an antenna array on a portion of a substrate having a particular value of permittivity, permeability or loss tangent. The requirements for these electrical properties can relate to form factor, electrical performance or other design issues. In any case, the limited choices of substrate materials that are presently available can require design compromises that are preferably avoided.

SUMMARY OF THE INVENTION

The invention concerns a method for fabricating a textured dielectric substrate for an RF circuit. The method can include the step of selecting a plurality of dielectric substrate materials. Each of the dielectric substrate materials can have a distinct combination or set of electrical properties that is different from the combination of electrical properties of every other one of dielectric substrate materials. For example, two dielectric substrate materials can differ from each other with regard to the value of at least one electrical property such as permittivity, permeability or loss tangent. A pattern can be selected which is comprised of at least two types of distinct areas respectively having the distinct sets of electrical properties, with each distinct area preferably dimensioned much smaller than a wavelength at a frequency of interest.

Subsequently, each of the dielectric substrate materials can be cut into a size and shape consistent with the distinct areas of the selected pattern so as to form a plurality of dielectric pieces. Finally, the dielectric pieces can be selectively arranged on a base plate in accordance with the selected pattern to form the textured dielectric substrate. This can be accomplished using a computer controlled pick and place machine.

A layer of adhesive is preferably disposed on the base plate prior to the arranging step. The adhesive layer can subsequently be cured, for example in a heating step. Further, at least one RF circuit element can be screen printed on the textured dielectric substrate. The textured dielectric substrate thus formed can have at least one effective electrical property at a frequency of interest that is different from each of the distinct sets of electrical properties associated with the individual dielectric materials.

DETAILED DESCRIPTION OF THE PREFERRED EMBODIMENTS

Computer modeling has shown that dielectric substrates with tailored electrical properties can be achieved by creating a textured substrate. Textured substrates have a geometric pattern of distance areas formed within the substrate. The distinct areas can have electrical characteristics such as permittivity, permeability or loss tangent that are different from one another. Because the dimensions of the pattern and the distinct areas are electrically small, the net effect is a substrate that appears to have effective dielectric properties that are actually a blend of those properties of each of the distinct areas. While computer modeling suggests that textured substrate materials hold much promise for future designs, the availability of suitable methods for fabrication of textured substrate materials have limited the commercial viability of this approach. The present invention described in relation to FIGS. 1-6 concerns a process for fabricating a textured substrate with tailored electrical properties.

Figure 1:
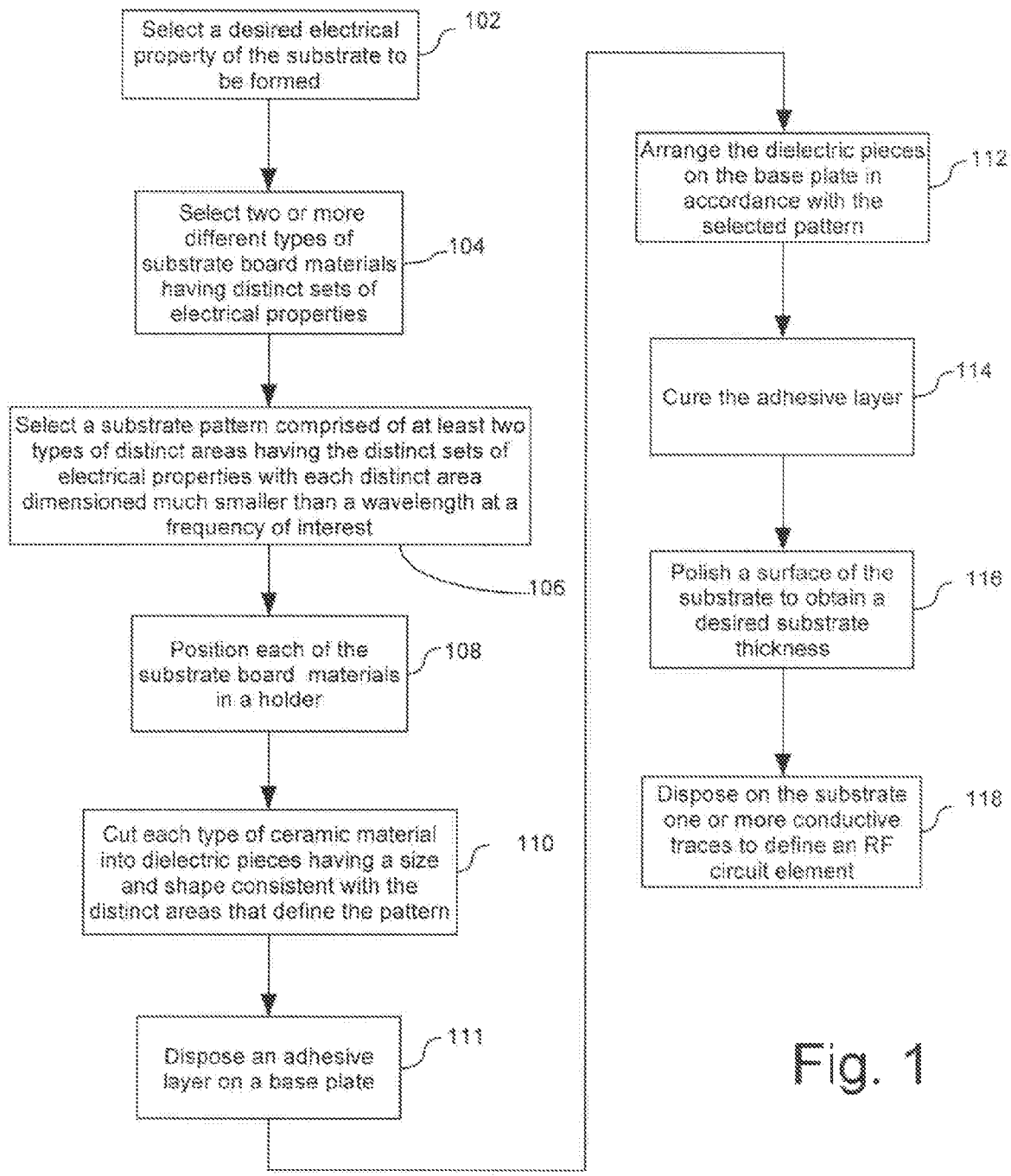
FIG. 1 is a flow chart that is useful for understanding a process for practicing the present invention.

A flow chart illustrating the process is shown in FIG. 1. As illustrated therein, the process can begin with step 102 by selecting one or more effective electrical properties that are desired for the substrate which is to be formed. These can include, without limitation, effective values of permittivity, permeability and loss tangent. In step 104, a plurality of different types of bulk substrate board materials are selected, each having distinct electrical properties. As used herein, the term "bulk" refers to material sized in pieces that is relatively large, e.g. larger than about a wavelength at a frequency of interest.

In step 106, the process continues with the selection of a substrate pattern that includes at least two types of distinct areas, each having distinct sets of electrical properties corresponding to the selected bulk dielectric board materials and dimensioned much smaller than a wavelength at a frequency of interest. The ability to predict the outcome of the effective electrical property of a textured substrate at a particular frequency band of interest has just recently become practical with advances in computer modeling and optimization. In general, the pattern selection can include choosing the size, shape and arrangement of two or more different types of dielectrics that are to be combined in a pattern to obtain a particular effective electrical property.

Those skilled in the art will recognize that to some extent, the order of steps 104 and 106 could be reversed under certain circumstances and the invention is not intended to be limited by the order shown in FIG. 1. In particular, the number of possible substrate texture patterns that can be used far exceed the number of bulk dielectric board substrates that are commercially available. Accordingly, it can be more convenient in many instances to first select the bulk dielectric board substrates in step 104. Thereafter a suitable substrate pattern can be determined to give a desired blending effect in step 106.

As used herein electrical properties include any of several electrical characteristics commonly associated with dielectrics, including permittivity, permeability, and loss tangent. References to "effective electrical properties" are used to distinguish the characteristics exhibited by textured dielectric materials fabricated with the processes described herein. Effective electrical properties of the textured substrate are to be distinguished from the bulk electrical properties of the bulk dielectric board materials from which the textured substrates are formed.

Figure 2:
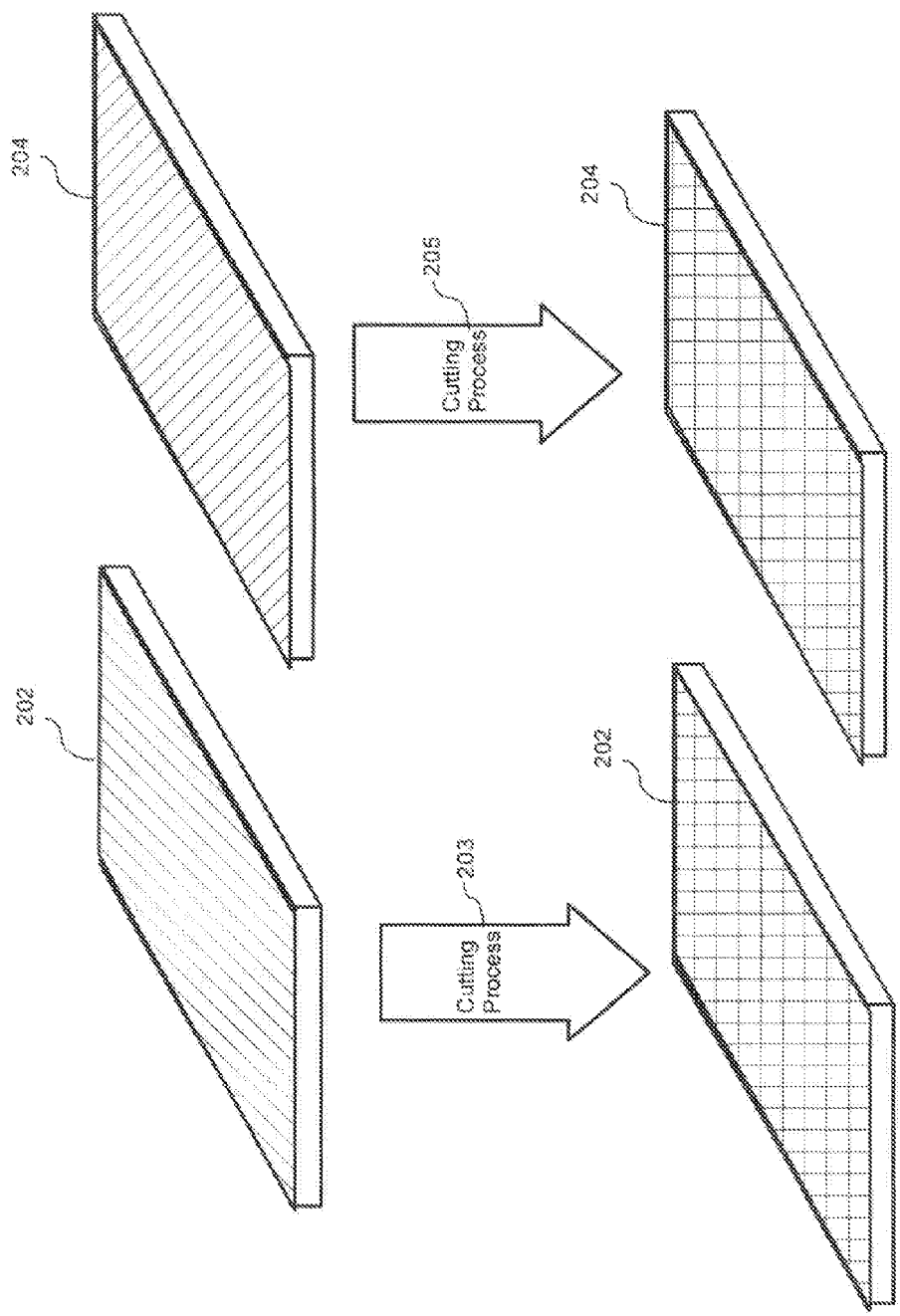
FIG. 2 is a top view illustrating two different types of dielectric board materials undergoing a cutting process.

Referring now to FIGS. 1 and 2, the the process can continue in step 108 with the positioning each of the two or more different types of bulk dielectric board material sheets 202, 204 in a suitable holder or cassette. According to a preferred embodiment, the dielectric board material can be selected so as to have a thickness that is approximately equal or slightly larger than the desired dielectric thickness of the completed substrate. Commercially available materials that can be used to form the dielectric board material sheets 202, 204 can include any of a wide variety of different types of commercially available composites. For example, Teflon® PTFE (PolyTetraFluoroEthylene) composites of glass fiber, woven glass and ceramics can be used for this purpose. Such products are commercially available from a variety of manufacturers including Rogers Corporation of Chandler, Ariz. Some specific types of bulk dielectric boards available from Rogers Corporation include RT/duroid product numbers 5880, 6002, and 6010LM. However, the invention is not limited to any particular substrate board type or material.

Figure 3:
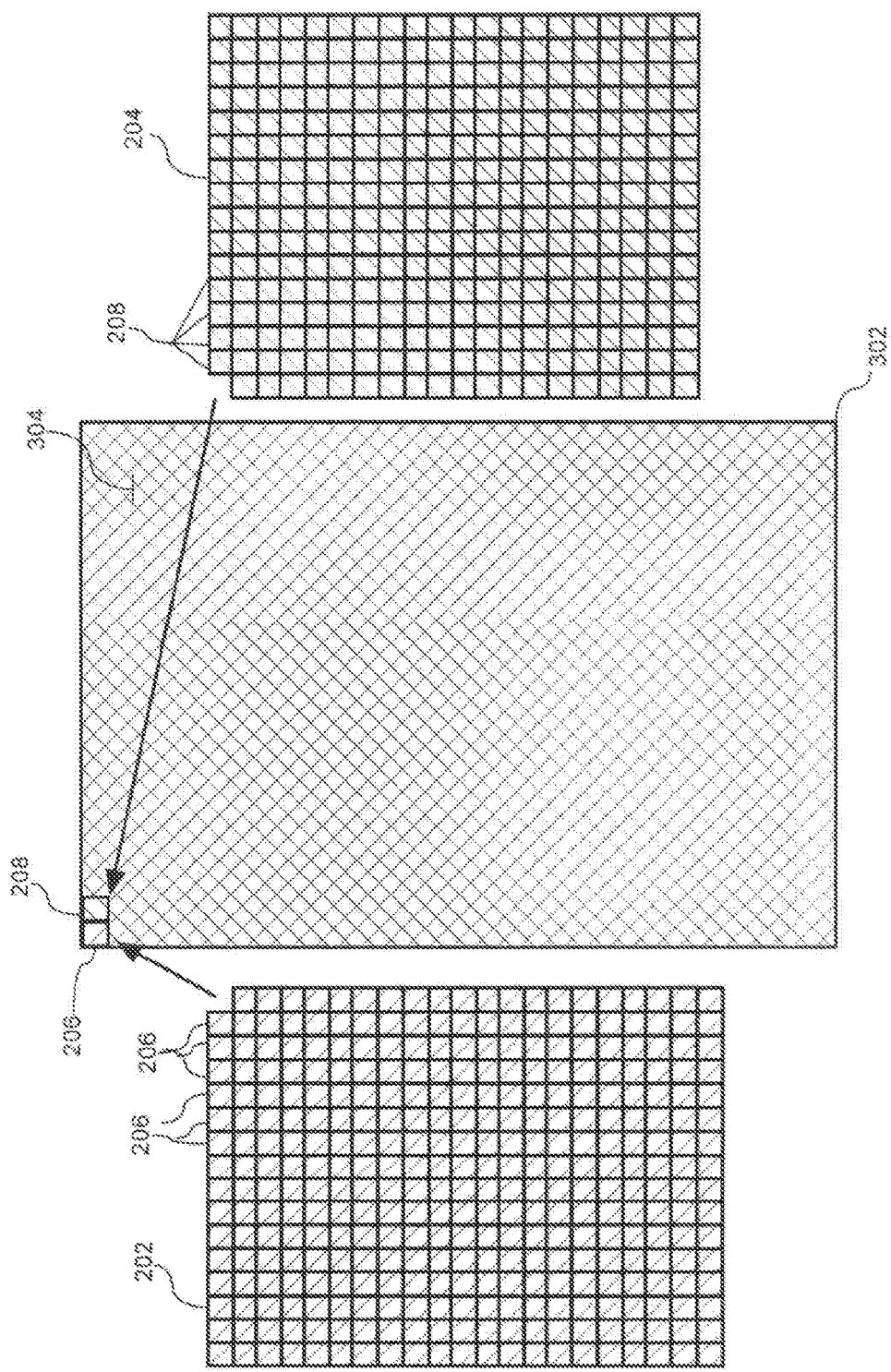
FIG. 3 is a top view of the two dielectric board materials of FIG. 2 with the pieces being placed on a base to create a substrate with a predetermined mosaic pattern.

FIG. 2 shows that the two sheets 202, 204 of dielectric board material can be automatically cut or diced into a number of small dielectric pieces 206 and 208. FIG. 3 is a top view of the sheets 202, 204 after the cutting process is complete as the pieces are being placed on base. The size and shape of the pieces are preferably selected to conform to the texture or pattern determined in step 106. In general, however, the dielectric pieces should be electrically small relative to the wavelength of interest for the device in which the completed substrate is to be used. For example, typical length and width of the dielectric pieces can be in a range of between about $\frac{1}{10}$ to $\frac{1}{50}$ of a wavelength, although it should be understood that the invention is not so limited. Also it may be noted that as a matter of convenience, the dielectric pieces 206, 208 in FIG. 3 are shown as having a square shape. However, it should be understood that the process is not so limited and more complex and intricate shapes are also possible. For example, and without limitation, the shapes may constitute triangles, rectangles, sawtooth patterns, interdigitated patterns, interlocking crosses, and so on.

The automated cutting equipment used to form the dielectric pieces 206, 208 can be provided with the sheets 202, 204 as input stock. Thus, dielectric board material sheets having a size of between about 1 inch to 6 inches on each side can be convenient, but the invention is not so limited. The sheets 202, 204 can be cut automatically with a dicing saw such as model no. 984-6 which is available from Kulicke & Soffa of Willow Grove, Pa. Precision automated saws of the kind described herein are more commonly used for singulating silicon semiconductor devices. However, when provided with a cutting blade appropriate for composites of glass fiber, woven glass or ceramics, they are particularly well suited for the present process.

It is desirable to cut the sheets 202, 204 in a very precise manner so as to minimize gaps between the dielectric pieces 206, 208 when they are assembled in a pattern to form the completed substrate. Depending on the thickness of the substrate, gaps of more than a few mills can cause variations in the effective electrical characteristics of the completed substrate. In general, the precision of the cutting process should be selected so that gaps between dielectric pieces are not more than about 10% of the overall thickness of the completed substrate. After cutting, the set of dielectric pieces 206, 208 can remain in the cassette or holder, or can be attached to a film adhesive to create a carrier medium to temporarily secure the dielectric pieces in a ordered manner. In any case, the set of dielectric pieces 206, 208 is preferably secured in a manner suitable for allowing the pieces to be efficiently accessed by a pick and place machine for assembly in the next step of the process.

In step 111, an adhesive layer 304 can be applied to a base plate 302. Base plate 302 can be formed of any suitable base material, depending upon the desired configuration of the substrate. For example the base plate can be a conductor if it is desired to provide a ground plane on one surface of the substrate. Alternatively, the base plate can also be formed of a semiconductor or a dielectric material. The adhesive layer 304 can be an electronic grade epoxy film adhesive. If the base plate 302 is a conductor, it can be advantageous to select a conductive type epoxy film adhesive. For example the adhesive film can be a silver filled epoxy with 70% silver particles.

In step 112, the dielectric pieces 206, 208 are arranged on the base plate 302 in accordance with the selected texture or pattern. In FIG. 3, the beginning of this process is shown with two dielectric pieces 206, 208 placed on the adhesive layer 304 in an alternating pattern. Commercially available computer controlled pick and place machines can be used for this step. Such equipment is available from a variety of sources. The degree of precision required for picking an placing of the dielectric pieces 206, 208 will depend on the RF wavelength at the frequency of interest. In general, placement accuracy should be sufficient to ensure that the gap between the dielectric pieces is less than about 0.01 wavelength. Once the dielectric pieces have been placed, it is preferred to avoid sliding the individual pieces to prevent adhesive from inadvertently being pushed between the dielectric pieces. This is especially important if adhesive layer 304 is a conductive adhesive as such irregularities in the ground plane can produce inconsistent electrical properties in the textured substrate.

Figure 5:
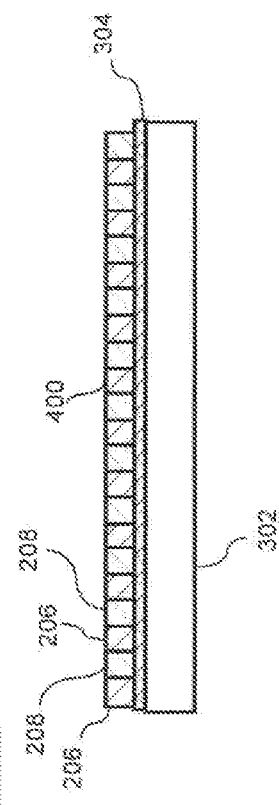
FIG. 5 shows a cross-sectional view of the substrate in FIG. 4 taken along line 6-6.
Figure 4:
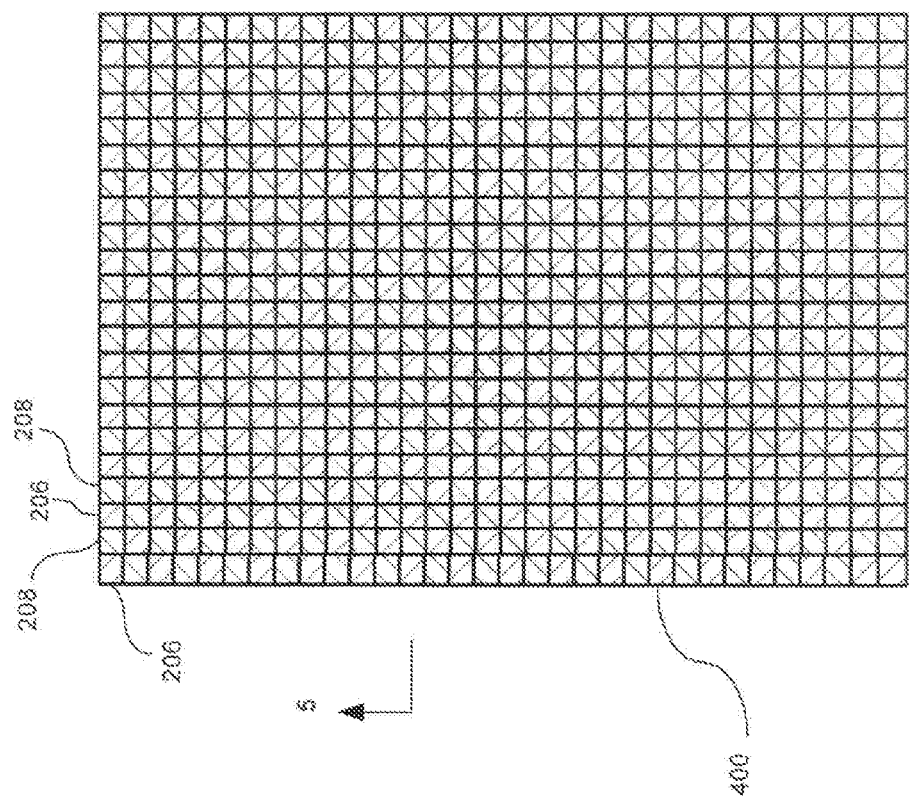
FIG 4 shows a top view of the substrate after all of the dielectric pieces have been arranged in a predetermined pattern.
Figure 6:
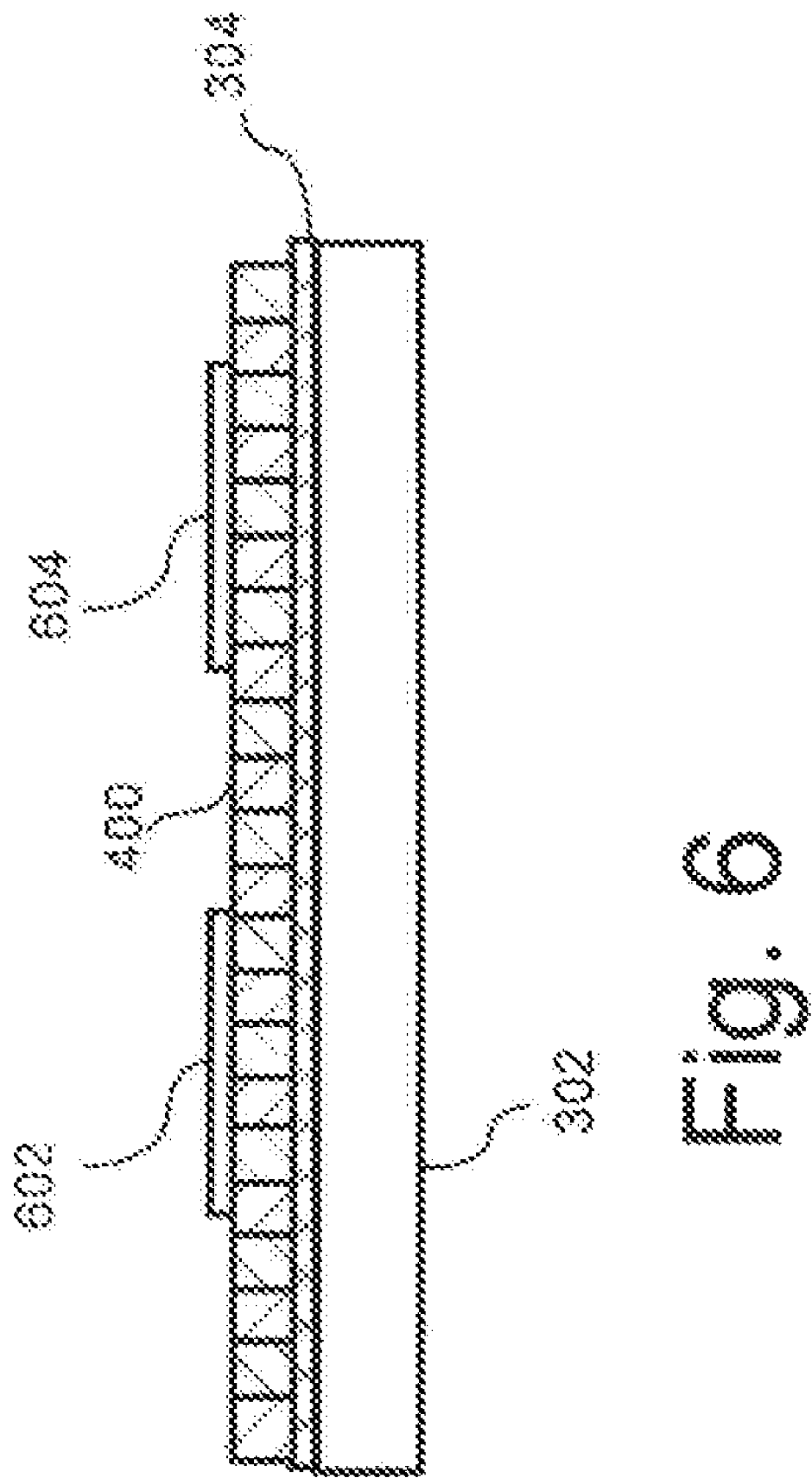
FIG. 6 shows the cross-sectional view of the substrate in FIG. 5 after conductive traces have been formed on the surface.

FIG. 4 is a top view showing the completed textured substrate 400 with all of the pieces 206, 208 placed on the adhesive layer 304 in an alternating checkerboard pattern following completion of step 112. FIG. 5 is a cross-sectional view of the textured substrate showing adhesive layer 304 and base plate 302. After all of the fired dielectric pieces 206, 208 are placed as shown in FIGS. 4 and 5, the epoxy adhesive layer is cured in step 114 to permanently secure the dielectric pieces in place. Curing time and temperature for the adhesive layer will vary depending on the particular material that is selected.

After the adhesive layer 304 has been cured, the entire textured substrate can be lapped or polished in step 116 to achieve the final thickness of the dielectric substrate that is required for the design. This step is also useful for smoothing out any irregularities as between the exposed outer surface of all the dielectric pieces to bring them to a consistent height. Polishing is preferably performed by machine using a suitable polishing mediums for the amount of material to be removed. For example, 10 to 40 micron grit wet slurrys can be used effectively for this purpose.

In step 118, one or more conductive elements 602, 604 can be screen printed on the textured substrate 400. Conductive elements 602 604 are shown disposed on the textured substrate 400 in FIG. 6. The screen printing on the array can be performed using a conventional electronics grade conductive epoxy or ink that cures in the range from 100° F. to 125° F.

We claim:

1. A method for fabricating a textured dielectric substrate for an RF circuit comprising the steps of:
    selecting a plurality of dielectric substrate materials, each of said plurality of dielectric substrate materials having a distinct set of electrical properties different from a remainder of said dielectric substrate materials;
    selecting a pattern comprised of at least two types of distinct areas having said distinct sets of electrical properties and each distinct area dimensioned much smaller than a wavelength at a frequency of interest;
    cutting each of said plurality of dielectric substrate materials into a size and shape consistent with said distinct areas to form dielectric pieces;
    selectively arranging said dielectric pieces on a base plate in accordance with said pattern to form said textured dielectric substrate having at least one effective electrical property at a frequency of interest that is different from each of said distinct sets of electrical properties.

2. The method according to claim 1 wherein said arranging step further comprises forming a single layer of said dielectric pieces on base plate in accordance with said pattern.

3. The method according to claim 2 further comprising the step of screen printing at least one RF circuit element on said textured ceramic dielectric substrate.

4. The method according to claim 1 further comprising the step of disposing a layer of adhesive on said base plate prior to said arranging step.

5. The method according to claim 4 further comprising the step of curing said adhesive layer in a heating step.

6. The method according to claim 4 further comprising the step of screen printing at least one RF circuit element on said textured dielectric substrate.

7. The method according to claim 1 further comprising arranging said dielectric pieces using a computer controlled pick and place machine.

8. The method according to claim 1 further comprising the step of screen printing at least one RF circuit element on said textured dielectric substrate.

9. The method according to claim 1 further comprising the step of polishing a surface of said textured ceramic dielectric substrate.

10. The method according to claim 8 further comprising the step of screen printing at least one RF circuit element on said textured ceramic dielectric substrate.

* * * * *